United States Patent
Ingalls

[19]

[11] Patent Number: 5,892,716
[45] Date of Patent: Apr. 6, 1999

[54] METHOD AND APPARATUS FOR GLOBAL TESTING THE IMPEDANCE OF A PROGRAMMABLE ELEMENT

[75] Inventor: Charles L. Ingalls, Meridian, Id.

[73] Assignee: Micron Technology, Inc., Boise, Id.

[21] Appl. No.: 90,258

[22] Filed: Jun. 4, 1998

[51] Int. Cl.⁶ .............................. G11C 16/04; G11C 7/00
[52] U.S. Cl. .................................. 365/189.05; 365/225.7
[58] Field of Search ................................ 365/225.7, 200, 365/201, 189.05

[56] References Cited

U.S. PATENT DOCUMENTS

| | | | |
|---|---|---|---|
| 5,680,360 | 10/1997 | Pilling et al. | 365/225.7 |
| 5,689,455 | 11/1997 | Mullarkey et al. | 365/225.7 |
| 5,706,238 | 1/1998 | Cutter et al. | 365/225.7 |
| 5,734,617 | 3/1998 | Zheng | 365/225.7 |
| 5,742,555 | 4/1998 | Marr et al. | 365/225.7 |

*Primary Examiner*—David Nelms
*Assistant Examiner*—Trong Phan

*Attorney, Agent, or Firm*—Dickstein Shapiro Morin & Oshinsky LLP

[57] ABSTRACT

A unique latch circuitry having both a latching and margin testing capability is provided. Every antifuse in a memory circuit is connected to a respective latch circuit. The latch circuits utilize a global input signal to configure a reference impedance with either a normal operational mode impedance or a test mode impedance. Once configured, and without any other additional circuitry, the latch circuits are capable of performing the latching or testing capability based upon comparisons to the reference impedance. When configured for the normal operational mode, the latch circuits read and output the status of their respective antifuses responsive to a control signal. When configured for the testing mode, the latch circuits test the impedance margin of their respective antifuses responsive to the same control signal. The configuration of the unique latch circuit, and the use of the same control signal for normal and test modes, allows for the global testing of all of the antifuses in a memory circuit while reducing the circuitry required to perform the testing. In addition, it is also possible to have different reference impedances for the normal and test modes.

59 Claims, 7 Drawing Sheets

METHOD AND APPARATUS FOR GLOBAL TESTING THE IMPEDANCE OF A PROGRAMMABLE ELEMENT

BACKGROUND OF THE INVENTION

1. Field of the Invention

This invention relates generally to integrated circuits and, in particular, to a method and apparatus for global testing the impedance of a programmable element within a memory circuit.

2. Description of the Related Art

Typical memory circuits include arrays of memory cells arranged in rows and columns. These memory circuits will also include several redundant rows and columns that are used as substitutes for defective locations in the memory array. When a defective memory array location is identified, rather than treating the entire array as defective, a redundant row or column is substituted for the defective row or column. This substitution is performed by assigning the address of the defective row or column to the redundant row or column such that, when an address signal corresponding to the defective row or column is received, the redundant row or column is addressed instead.

To make the substitution of the redundant row or column substantially transparent to a system including the memory circuit, the memory circuit utilizes an address detection circuit. The address detection circuit monitors row and column addresses and enables redundant rows or columns if the address of a defective row or column is detected. FIG. 1 illustrates the typical memory circuit 10 including an address detection circuit 100, control and address circuitry 12, an array of memory cells 14 and row and columns of redundant memory cells 16.

One type of address detection circuit 100 is a fuse-bank address detection circuit. A fuse-bank address detection circuit utilizes several fuse-bank circuits to control the redundant rows and columns. Each fuse-bank circuit corresponds to one of the redundant rows or columns. If there are eight redundant rows and eight redundant columns, for example, then the address detection circuit 100 will include sixteen fuse-bank circuits. Each fuse-bank circuit includes a bank of sense lines, each sense line connected to a respective fuse. Each sense line corresponds to one bit of a memory address since each fuse-bank will be programmed with an address of a defective memory array location. If an address comprises eight bits, then each fuse-bank circuit includes eight sense lines, each with corresponding fuses.

The sense lines are "programmed" by blowing fuses in a pattern corresponding to the address word of the defective row or column (hereinafter referred to as the programmed addresses). The programmed addresses are then detected by initially applying a test voltage across the bank of sense lines. Then, bits of an external address are applied to the sense lines. If the pattern of blown fuses corresponds exactly to the pattern of the external address bits, the sense lines block current and the voltage across the bank remains latched high. Otherwise, at least one sense line conducts and the voltage falls. Therefore, a high voltage indicates that the programmed address matches the external address while a low address does not. A matched address indicates that the redundant row or column should be used.

Recently, to save the costs and labor required to blow the conventional fuse, antifuses have replaced fuses in the address detection circuit 100. Antifuses are capacitive-type structures which, in their unblown states, form open circuits. Antifuses are "blown" by applying a high voltage across the antifuse. The high voltage causes the capacitive-type structure to break down, forming a conductive path through the antifuse. Therefore, blown antifuses conduct while unblown anitifuses do not.

FIG. 2a illustrates an antifuse circuit 110 used in an antifuse-bank circuit. The circuit 110 corresponds to one bit of a programmed address. As previously stated, if an address consisted of eight bits, then each antifuse-bank circuit would include eight antifuse circuits 110. An antifuse 112, illustrated in its unblown state, is connected to a switchable signal CGND and a latch circuit 114. During normal operation, the switchable signal CGND is a ground potential to provide a reference for the antifuse 112. To blow or "program" the antifuse 112, the switchable signal CGND is supplied with a high voltage sufficient enough to cause the capacitive-type structure of the antifuse 112 to break down. Generally, the high voltage used to blow the antifuse is referred to as a programming voltage. Once blown, the antifuse 112 has a known impedance, plus or minus a predetermined margin, which is detected by the latch circuit 114. FIG. 2b illustrates the antifuse circuit 110 of FIG. 2a where the blown antifuse 112 is represented by its known impedance $R_{112}$. When strobed by logic in the address detection circuit 100, the latch circuit 114 detects the impedance $R_{112}$ of the antifuse 112 and outputs an output signal that is either a logical "1" if the antifuse is blown or a logical "0" if the antifuse is not blown. This output signal when combined with the output signals of the remaining antifuse circuits 110 of the antifuse-bank circuit forms an address of a defective memory location (i.e., a programmed address). The operation of antifuse in an address detection circuit 100 is described, for example, in U.S. Pat. No. 5,374,617 (Zheng), U.S. Pat. No. 5,742,555 (Marr et al.), and U.S. Pat. No. 5,706,238 (Cutter et al.), all assigned to Micron Technology Inc. and incorporated by reference herein.

One known problem with antifuses 112 is that they may not always have their expected or desired impedance $R_{112}$ after being programmed. As stated above, an external address is received by the address detection circuit 100 which is compared to the antifuse-bank programmed addresses. The anitfuses 112 of each antifuse-bank, corresponding to an address of a defective row or column, must be read and latched by the latch circuits 114 and then compared to the external address. There must be an exact match before a redundant row or column can be used. If the impedance $R_{112}$ of the antifuse 112 is not low enough, the latch circuit 114 will not detect that the antifuse 112 is blown and therefore, the correct status (i.e., blown antifuse 112) of the antifuse 112 will not be latched; this leads to a programmed address that does not match the defective address. Since the external address does not match any of the programmed addresses, the address detection circuit 100 will not substitute a redundant row or column for a defective row or column. In fact, the programmed address may match an external address of a non-defective memory array location. Accordingly, the redundant memory may substitute for good memory.

FIG. 3 illustrates a mechanism of testing the impedances $R_{112}$ of antifuses 112. Four antifuse circuits 110 are illustrated, each having a respective antifuse 112 and associated latch 114. It must be noted, however, that there would be an antifuse circuit 110 for every bit in a programmed address and that four circuits 110 are illustrated for convenience purposes only. A test circuit for testing the impedance value of the antifuse 112 is also shown as test latch circuit 106 and multiplexer 104. The outputs of the circuits 110 are connected to a multiplexer 104. The multiplexer 104 is connected to a test latch circuit 106. The test latch circuit 106 is configured in the same manner as the latch circuits 114 included in the antifuse circuits 110. That is, the test latch circuit 106 will detect whether an antifuse 112 has been blown by measuring its impedance $R_{112}$.

When testing the impedances of the antifuses 112, the multiplexer 104 sequentially connects the antifuses 112 to the test latch circuit 106. The test latch circuit 106 compares the impedance $R_{112}$ of the antifuse 112 being tested to a reference impedance $R_{REF}$ (i.e., the expected impedance plus a margin). If the impedance $R_{112}$ is greater than the reference impedance $R_{REF}$ and the antifuse 112 has been blown, then the antifuse 112 impedance $R_{112}$ would lead to an erroneous programmed address when sensed by the latch circuit 114. Repairs or replacements would be required in order to use the antifuse circuit 110. If the impedance $R_{112}$ is less than the reference impedance $R_{REF}$, then the antifuse 112 would not lead to an erroneous programmed address and the antifuse circuit 110 will be used. Each antifuse circuit 110 is tested one at a time by the test latch circuit 106 during sequential operation of the multiplexer 104.

Although the above mechanism can properly detect when a blown antifuse 112 has an impedance $R_{112}$ that is too high and would lead to incorrect programmed addresses, it still has some shortcomings. For example, the mechanism illustrated in FIG. 3 requires the use of a multilplexer 104 and a test latch circuit 106 and the numerous respective connections to the antifuse circuits 110. This additional circuitry adds costs and uses up valuable space on the semiconductor die. In addition, the antifuses 112 are tested one at a time in a sequential manner. This leads to slower testing of the antifuses 112, particularly if numerous redundant rows and columns were to be used.

Therefore, there is a need and desire to provide a method and apparatus for global testing the impedance of an antifuse while reducing the circuitry required to perform the testing.

In addition, manufacturers may require a blown antifuse 112 to have a smaller impedance margin during in-house testing than is actually required by users once the product is out in the field. To do so, however, a test latch circuit 106 that is not configured the same as the latch circuits 114 would be required. This adds additional steps in the manufacturing process of the memory circuit 10 and again consumes more circuit area. Therefore, there is a need and desire to provide a method and apparatus for testing the antifuse for different impedance values, but without requiring test circuitry that differs from the circuitry required to latch the status of the antifuse.

BRIEF SUMMARY OF THE INVENTION

The present invention provides a method and apparatus for global testing the impedance of an antifuse while reducing the circuitry required to perform the testing.

The present invention also provides a method and apparatus for global testing the impedance of an antifuse that does not require test circuitry that differs from the circuitry required to latch the status of the antifuse.

The above features and advantages are achieved by providing unique latch circuitry having both a latching and margin testing capability. Every antifuse in a memory circuit is connected to a respective latch circuit. The latch circuits utilize a global input signal to configure a reference impedance with either a normal operational mode impedance or a test mode impedance. Once configured, and without any other additional circuitry, the latch circuits are capable of performing the latching or testing capability based upon comparisons to the reference impedance. When configured for the normal operational mode, the latch circuits read and output the status of their respective antifuses responsive to a control signal. When configured for the testing mode, the latch circuits test the impedance margin of their respective antifuses responsive to the same control signal. The configuration of the unique latch circuit, and the use of the same control signal for normal and test modes, allows for the global testing of all of the antifuses in a memory circuit while reducing the circuitry required to perform the testing. In addition, it is also possible to have different reference impedances for the normal and test modes.

BRIEF DESCRIPTION OF THE DRAWINGS

The foregoing and other objects and advantages of the invention will become more apparent from the detailed description of the preferred embodiments of the invention given below with reference to the accompanying drawings in which:

FIG. 6 is a block diagram of a computer system containing a memory circuit using an address detection circuit containing the latch circuit illustrated in FIG. 4a.

DETAILED DESCRIPTION OF THE PREFERRED EMBODIMENTS

Figure 3:
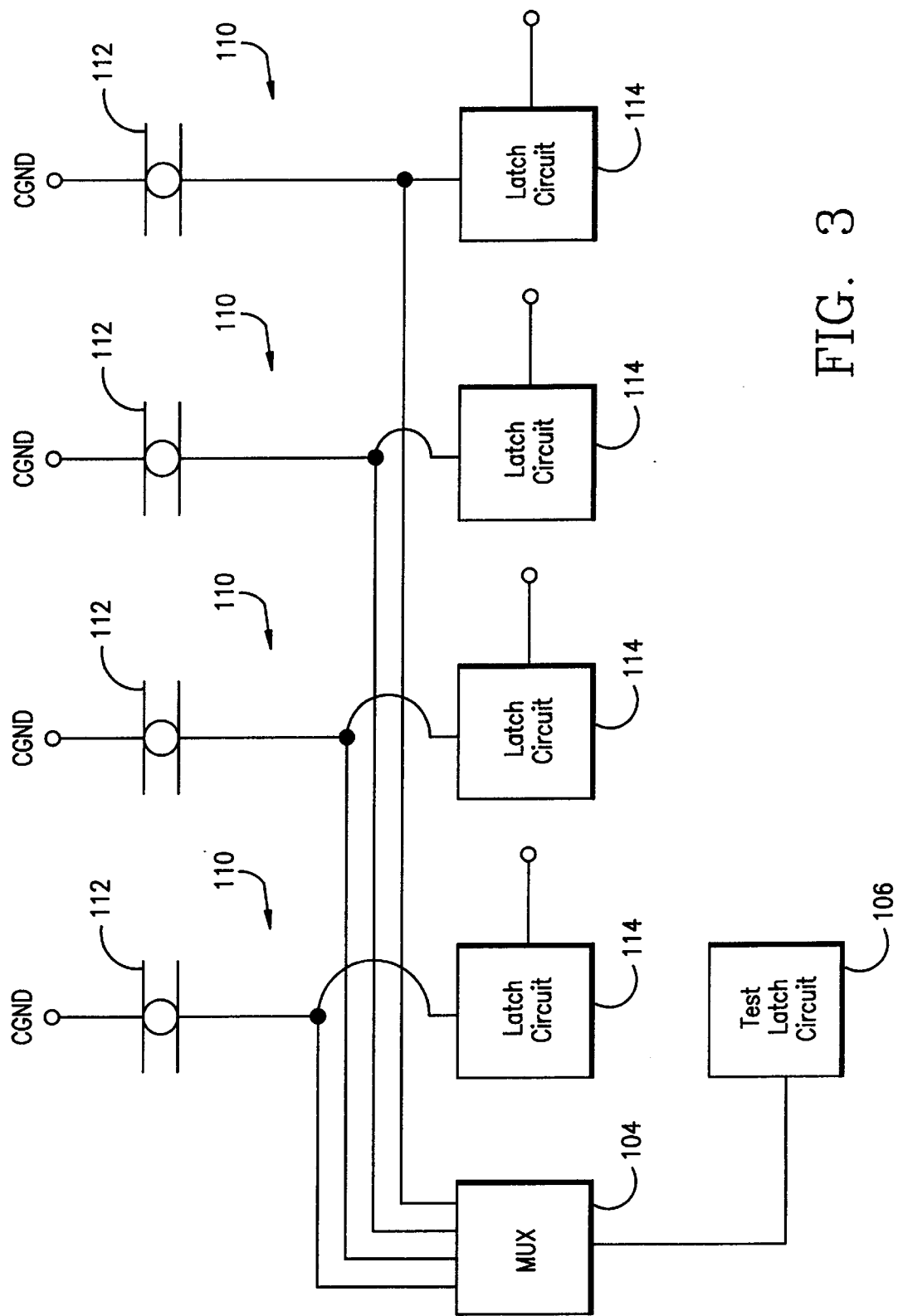
FIG. 3 illustrates a conventional method of performing an impedance margin test on an antifuse.
Figure 4A:
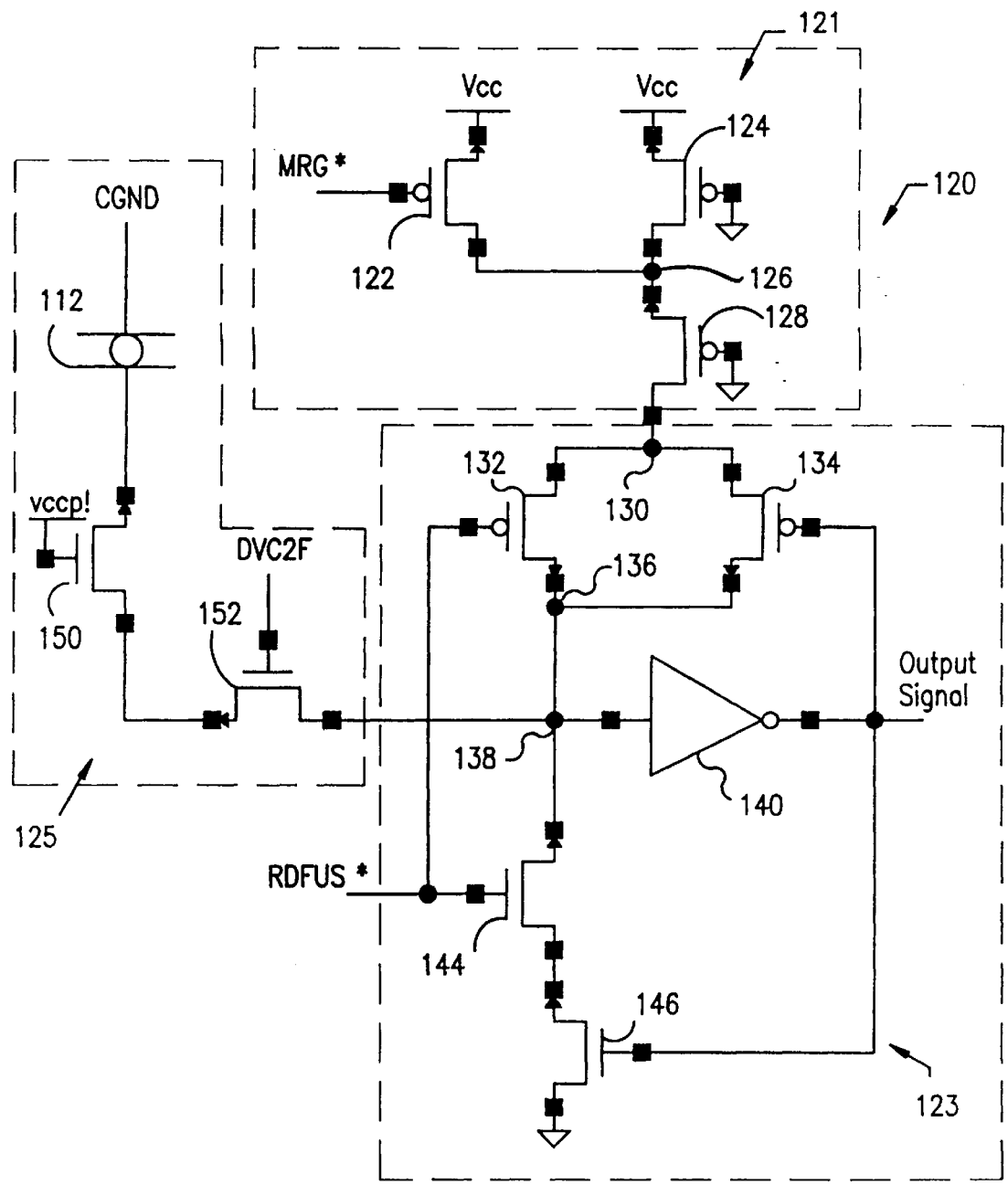
FIG. 4a illustrates a latch circuit constricted in accordance with the present invention.

FIG. 4a illustrates a latch circuit 120 constructed in accordance with the present invention. The latch circuit 120 replaces the latch circuit 114 (FIG. 3) used in the antifuse circuits 110 included within the address detection circuit 100 (illustrated in FIG. 1) as well as the test latch circuit 106 and the multiplexer 104 (FIG. 3). As will he described below, the latch circuit 120 has both a latching and margin testing capability. Every antifuse 112 in the memory circuit 10 is connected to a respective latch circuit 120. The latch circuits 120 utilize a global input signal MRG* to configure a reference impedance $R_{REF}$ with either a normal operational mode impedance or a test mode impedance. Once configured, and without any other additional circuitry, the latch circuits 120 are capable of performing the latching or testing capability based upon comparisons to the reference impedance $R_{REF}$. When configured for the normal operational mode, the latch circuits 120 read and output the status of their respective antifuses 112 responsive to a control signal RDFUS*. When configured for the testing mode, the latch circuits 120 test the impedance margin of their respective antifuses 112 responsive to the same control signal RDFUS*. The configuration of the latch circuit 120, and the use of the same control signal RDFUS* for normal and test modes, allows for the global testing of all of the antifuse 112 in the memory circuit 10 while reducing the circuitry required to perform the testing. In addition, it is also possible to have different reference impedances $R_{REF}$ for the normal and test modes.

Each of the latch circuits 120 used in the memory circuit 10 is identical except to the extent of the blown or unblown state of the antifuses 112. The latch circuit 120 includes five p-channel transistors 122, 124, 128, 132, 134, four n-channel transistors 144, 146, 150, 152 and an inverter 140. The latch circuit 120 includes three principal portions, a test and reference portion 121, an output latch portion 123 and antifuse sensing portion 125.

The test and reference portion 121 is used to create the desired reference impedance $R_{REF}$ needed to detect the status of the antifuse 112 under normal and test conditions. The portion 121 includes the first and second p-channel transistors 122, 124 connected in parallel with their source terminals connected to the power supply voltage VCC and their drains connected at node 126. The gate of the second p-channel transistor is connected to a ground potential, and thus, is always on. The gate of the first p-channel transistor is connected to the global margin test configuration signal MRG* and will be turned on only when the active-low configuration signal MRG* is low (i.e., configure for margin test). The third p-channel transistor 128 has its source terminal connected to the node 126, its gate connected to a ground potential (i.e., always on) and its drain connected to the latch portion 123 at node 130.

The operation of the test and reference portion 121 now follows. The second and third p-channel transistor 124, 128 are "sized" such that their additive serially connected impedances $R_{124}$, $R_{128}$ define the reference impedance $R_{REF}$ for the antifuse 112 under normal operation. In addition, the third p-channel transistor 128 is "sized" such that when the second p-channel transistor 124 is bypassed (discussed below with reference to FIG. 4b) its impedance $R_{128}$ alone will be the reference impedance $R_{REF}$ for the antifuse 112 under test conditions. Accordingly, the test and reference portion 121 is configurable to have a reference impedance $R_{REF}$ that is either the impedance $R_{128}$ of the third p-channel transistor 128 or the combination of the impedances $R_{124}$, $R_{128}$ of the second and third p-channel transistors 124, 128.

It is well known in the art that the amount of current a MOS transistor can carry is equal to W/L (where W is the width of the transistor and L is the gate length of the transistor). Accordingly, the gate length of a transistor controls the current flowing through it, which also sets its impedance. The larger the gate length, the higher the impedance. A transistor with a gate length of 100 microns, for example, will have an impedance of approximately 150K Ohms. Typically, 150K Ohms is used as the maximum impedance for a blown antifuse 112. A manufacturer, however, would like to test the antifuse 112 against a much lower impedance, e.g., 30K Ohms, to ensure that a breakdown in the antifuse 112 will not lead to an impedance $R_{112}$ greater than the maximum allowable impedance. A transistor with a gate length of 20 microns would have an impedance of approximately 30K Ohms. If two transistors were used to achieve the maximum allowable impedance 150K Ohms, for example, then one transistor would have a gate length of 20 microns and the other would have a gate length of 80 microns. Accordingly, the third p-channel transistor 128 will have a gate length of approximately 20 microns such that its impedance $R_{128}$ alone is equivalent to the desired reference impedance $R_{REF}$ to be used during a test mode condition while the second p-channel transistor 124 will have a gate length of approximately 80 microns such that its impedance $R_{124}$ is combined with the impedance $R_{128}$ of the third p-channel transistor 128, the desired reference impedance $R_{REF}$ to be used during normal operational conditions is created. The first p-channel transistor 122 is to be used as a switch and its size will be kept to a minimum to avoid unwanted voltage drops.

Figure 4B:
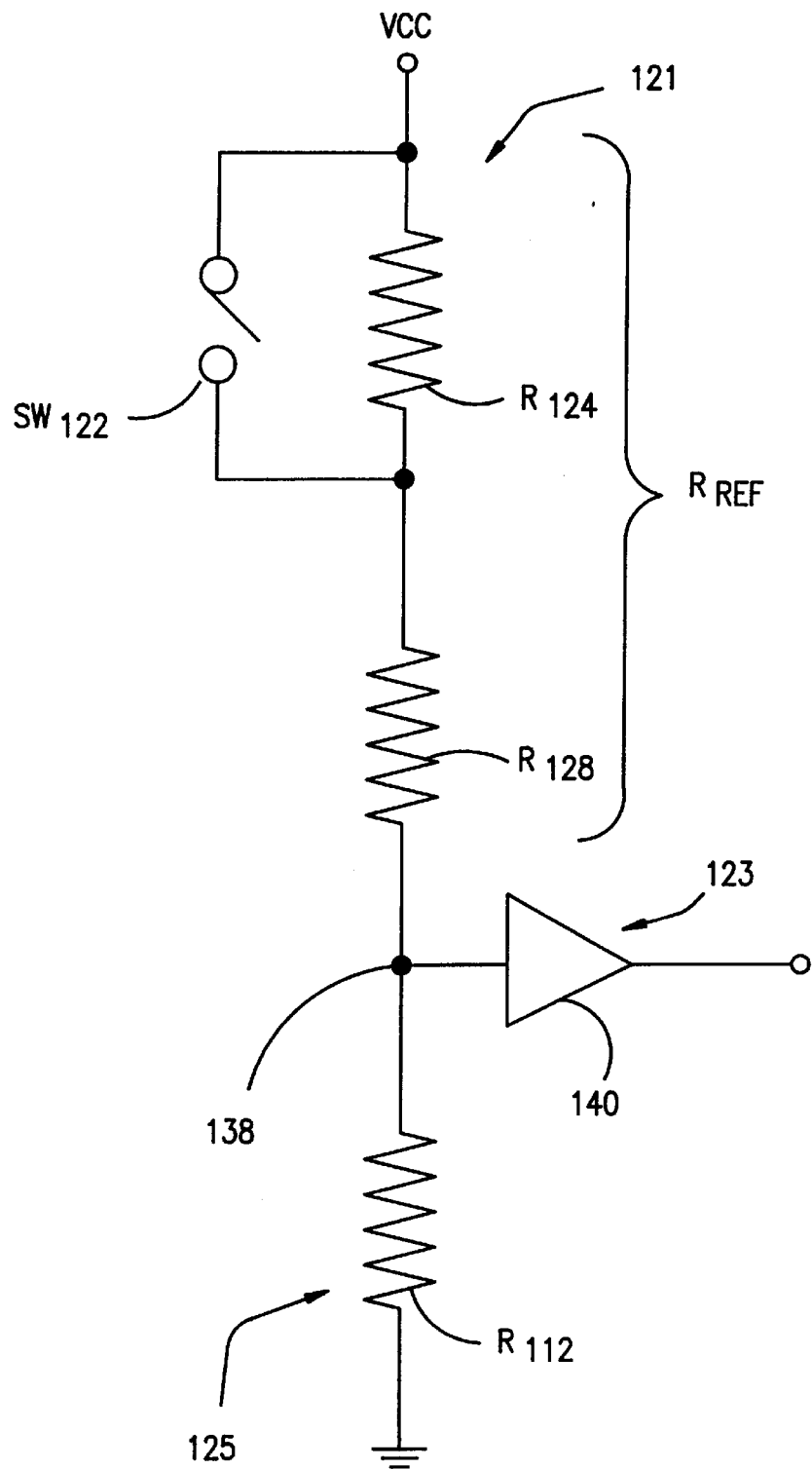
FIG. 4b illustrates the latch circuit of FIG. 4b where a blown antifuse and the latch circuit elements are represented by their known impedances.

FIG. 4b illustrates the second and third p-channel transistors 124, 128 represented by their equivalent impedances $R_{124}$, $R_{128}$ and the first p-channel transistor 122 by its electrical equivalent switch $SW_{122}$. In normal operation, the global test signal MRG* will be high (i.e., not configured for margin test) and therefore, the first p-channel transistor 122 will be off. Accordingly, the switch $SW_{122}$ will be open. This allows the two impedances $R_{124}$, $R_{128}$ to add and form the reference impedance $R_{REF}$. In test conditions, the global test signal MRG* will be low (i.e., configured for margin testing) and therefore, the first p-channel transistor 122 will be on. Accordingly, the switch $SW_{122}$ will be closed. This allows only the impedance $R_{128}$ (and the minimal impedance of $SW_{122}$) to form the reference impedance $R_{REF}$.

The antifuse sensing portion 125 is used to sense the status of an antifuse 112 and to pass on this status to the output latch portion 123. The antifuse use sensing portion 125 includes a third n-channel transistor 150 having its source connected to the antifuse 112, its gate connected to a pumped-up power supply voltage VCCP and its drain connected to the source of a fourth n-channel transistor 152. The pumped-up supply voltage VCCP is a voltage slightly higher than the power supply voltage VCC, but lower than the programing voltage required to blow the antifuse. The fourth n-channel transistor 152 has its gate connected to a device enable voltage DVC2F, which is approximately VCC/2 and has its drain connected to the latch portion 123 at node 138.

The operation of the antifuse sensing portion 125 is as follows. The status (i.e., the blown or unblown impedance) of the antifuse 112 is input into the third n-channel transistor 150 and passed through the fourth n-channel transistor 152 to the output latch portion 123 at node 138. This status directly corresponds to an impedance $R_{112}$ of the antifuse 112 as illustrated in FIG. 4b. The third n-channel transistor 150 during programming acts as a resistive element between the antifuse 112 and the node 138. Thus, the third n-channel transistor 150 limits the voltage applied to the node 138 (from the antifuse 112) to prevent high voltages from the antifuse 112 from causing a breakdown of the remaining transistors within the latch circuit 120. The fourth n-channel transistor 152 acts as an isolating transistor to prevent high voltages which occur during the programming of the antifuse 112 from effecting the remainder of the latch circuit 120 when the antifuse is being blown. This is done by turning off the device enable voltage DVC2F when the programming voltage is being applied to the antifuse 112.

The output latch portion 123 is used to detect and continuously output in logic levels the status of the antifuse 112. The portion 123 includes the fourth and fifth p-channel transistors 132, 134 connected in parallel with their source terminals connected at node 130 and their drain terminals connected at node 136 and node 138 (it must be noted that nodes 136 and 138 are the same node and that the two reference numerals 136, 138 are used to represent the aforementioned connections at this node). The fifth p-channel transistor 134 has its gate connected to the output of the inverter 140 and will be turned on only when the output of the inverter is low. The fourth p-channel transistor has its gate terminal connected to the read antifuse strobe RDFUS* and will be turned on only when the active-low read antifuse strobe RDFUS* is low (i.e., reading of antifuse status in progress). The first n-channel transistor 144 has its drain terminal connected to the source terminal of a second n-channel transistor 146, its source connected to node 138, its gate connected to the read antifuse strobe RDFUS* and will be turned on only when the active-low read antifuse strobe RDFUS* is high (i.e., reading of antifuse status is not in progress). The second n-channel transistor 146 has its source connected to a ground potential and its gate connected to the output of the inverter 140 and will be activated when the inverter 140 output is high. Node 138 serves as the input to the inverter 140. Under normal operation, the inverter 140 provides a logical "1" output signal when the antifuse 112 is blown or a logical "0" output when the antifuse is not blown. Under testing conditions, the inverter 140 provides a logical "1" output signal when the antifuse 112 is blown and has a proper impedance or a logical "0" output when the antifuse is not blown or has an improper impedance.

The operation of the output latch portion 123 is as follows. When the read antifuse strobe RDFUS* is low, the fourth p-channel transistor 132 is turned on allowing the reference impedance $R_{REF}$ from the test and reference portion 121 to connect with node 138. The first n-channel transistor 144 is off while the read antifuse strobe RDFUS* is low. The impedance $R_{112}$ of the antifuse 112 is also present at node 138 as can be seen in FIG. 4b. At this point, the input from the test and reference portion 121 and the input from the antifuse sensing portion 125 and the node 138 act as a divider circuit. If the reference impedance $R_{REF}$ is higher than the impedance $R_{112}$ of the antifuse 112, then the voltage is pulled-down by $R_{112}$ and a low voltage (through ground) is present at node 138 and the output of the inverter 140 is high. A high output indicates that the antifuse 112 is blown. If the impedance $R_{112}$ of the antifuse 112 is higher than the reference impedance $R_{REF}$, then the voltage is pulled-up by the $R_{REF}$ and a high voltage is present at node 138 and the output of the inverter 140 is low. A low output from the inverter 140 indicates that either the antifuse 112 has not been blown or that it has been blown and the impedance $R_{112}$ is improperly high. A final determination of the antifuse status is made during the testing of the device by the manufacturer.

The remainder of the output latch portion 123 operates to continuously output the status of the antifuse 112 as follows. When the read antifuse strobe RDFUS* is high, the fourth p-channel transistor 132 is turned off and the first n-channel transistor 144 is turned on. At this point, the fifth p-channel transistor 134 and the second n-channel transistor 146 and the inverter 140 combine to latch the output of the inverter 140 as follows. If the inverter 140 output is high, the second n-channel transistor 146 is on, the fifth p-channel transistor 134 is off and the voltage present at node 138 is continued to be pulled down by the first and second n-channel transistors 144, 146 resulting in a continuous high output from the inverter 140. If the inverter 140 output is low, the second n-channel transistor 146 is off, the fifth p-channel transistor 134 is on and the voltage present at node 138 is continued to be pulled up by the fifth p-channel transistor 134 and the remainder of the test and reference portion 121 resulting in a continuous low output from the inverter 140.

Accordingly, under testing conditions (i.e., when the manufacturer is attempting to determine whether the antifuse 112 have proper impedances $R_{112}$ after being programmed) the latch circuit 120 uses a reference impedance ($R_{REF}$ equivalent to the manufacturer's specifications to ensure that future failures will not arise. This is performed by closing the switch $SW_{122}$ such that the impedance $R_{124}$ of the second p-channel transistor 124 is bypassed and only the much lower impedance $R_{128}$ of the third p-channel transistor is used. While under normal conditions (i.e., when the address detection circuit 100 is attempting to match an external address to a programmed address), the latch circuit 120 utilizes a reference impedance $R_{REF}$ suitably chosen to determine when an already tested and verified antifuse 112 has been blown. This is performed by opening the switch $SW_{122}$ such that the impedance $R_{124}$ of the second p-channel transistor 124 is combined with the impedance $R_{128}$ of the third p-channel transistor to form a higher reference impedance $R_{REF}$.

Figure 1:
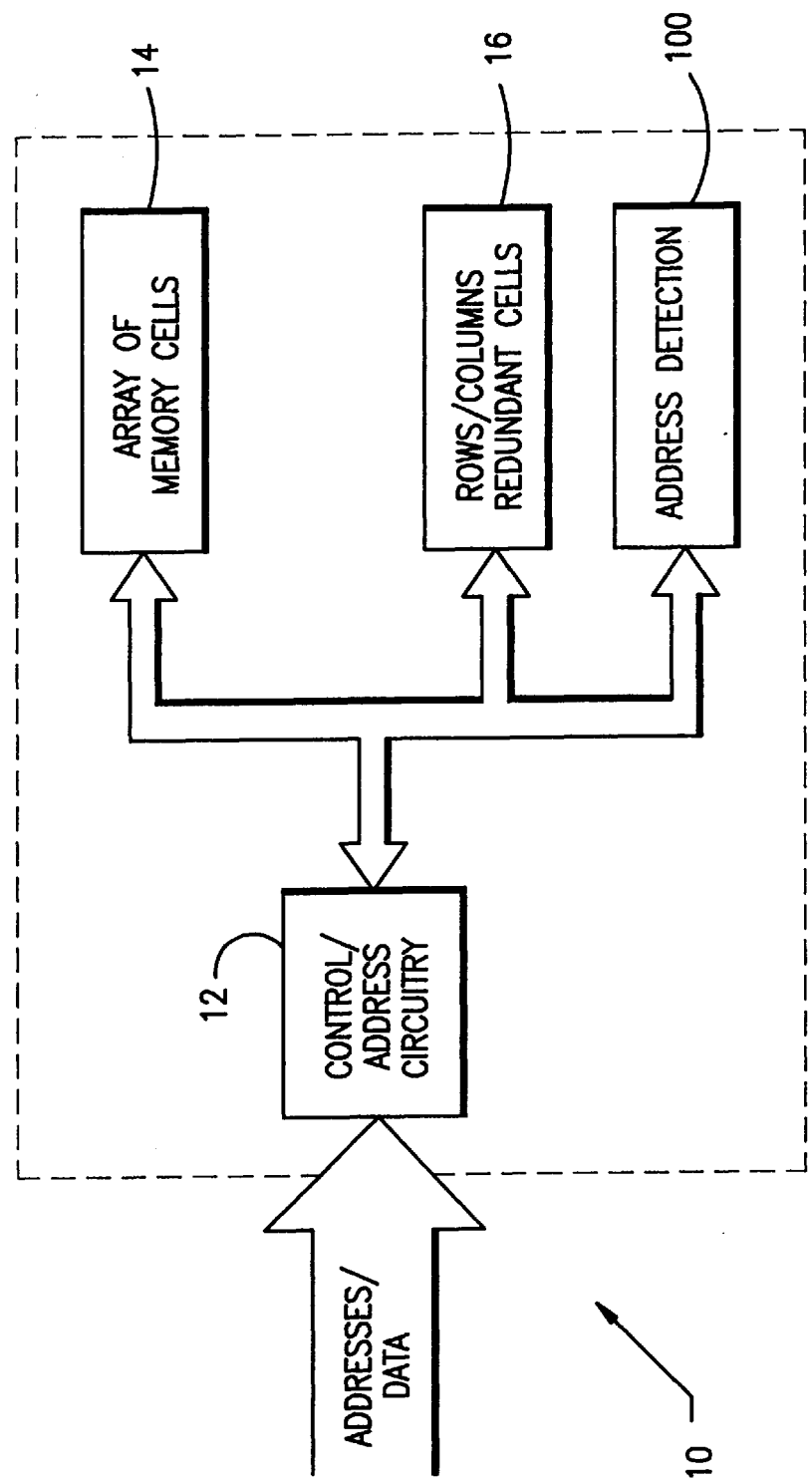
FIG. 1 is a block diagram of a typical redundant memory circuit.
Figure 2A:
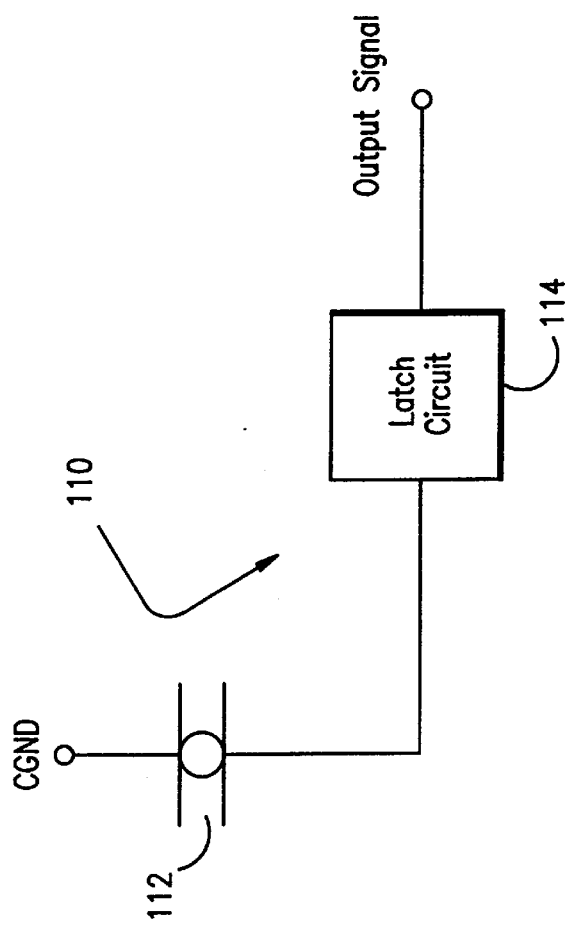
FIG. 2a illustrates an antifuse circuit used in the address detection circuit illustrated in FIG. 1.
Figure 2B:
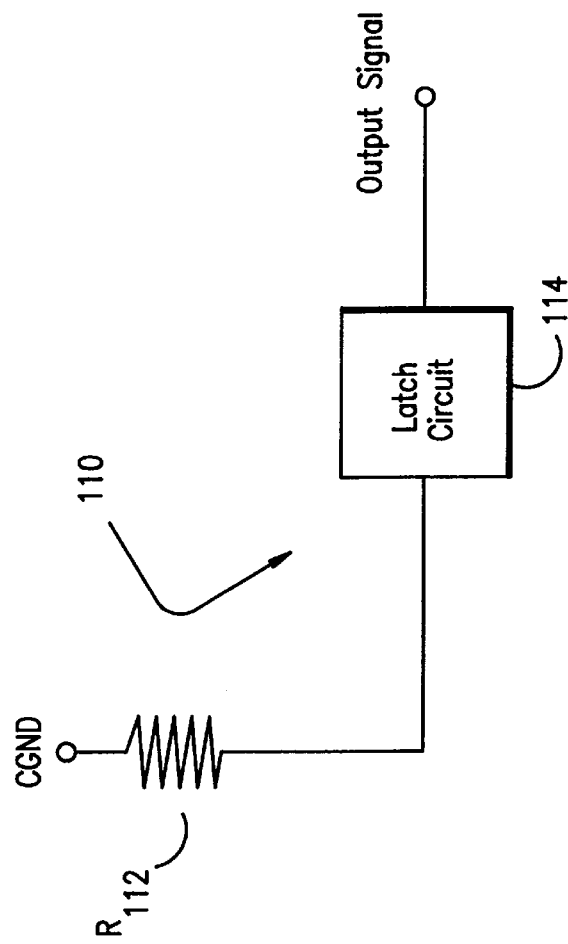
FIG. 2b illustrates the antifuse circuit of FIG. 2a where the blown antifuse is represented by its known impedance.
Figure 5:
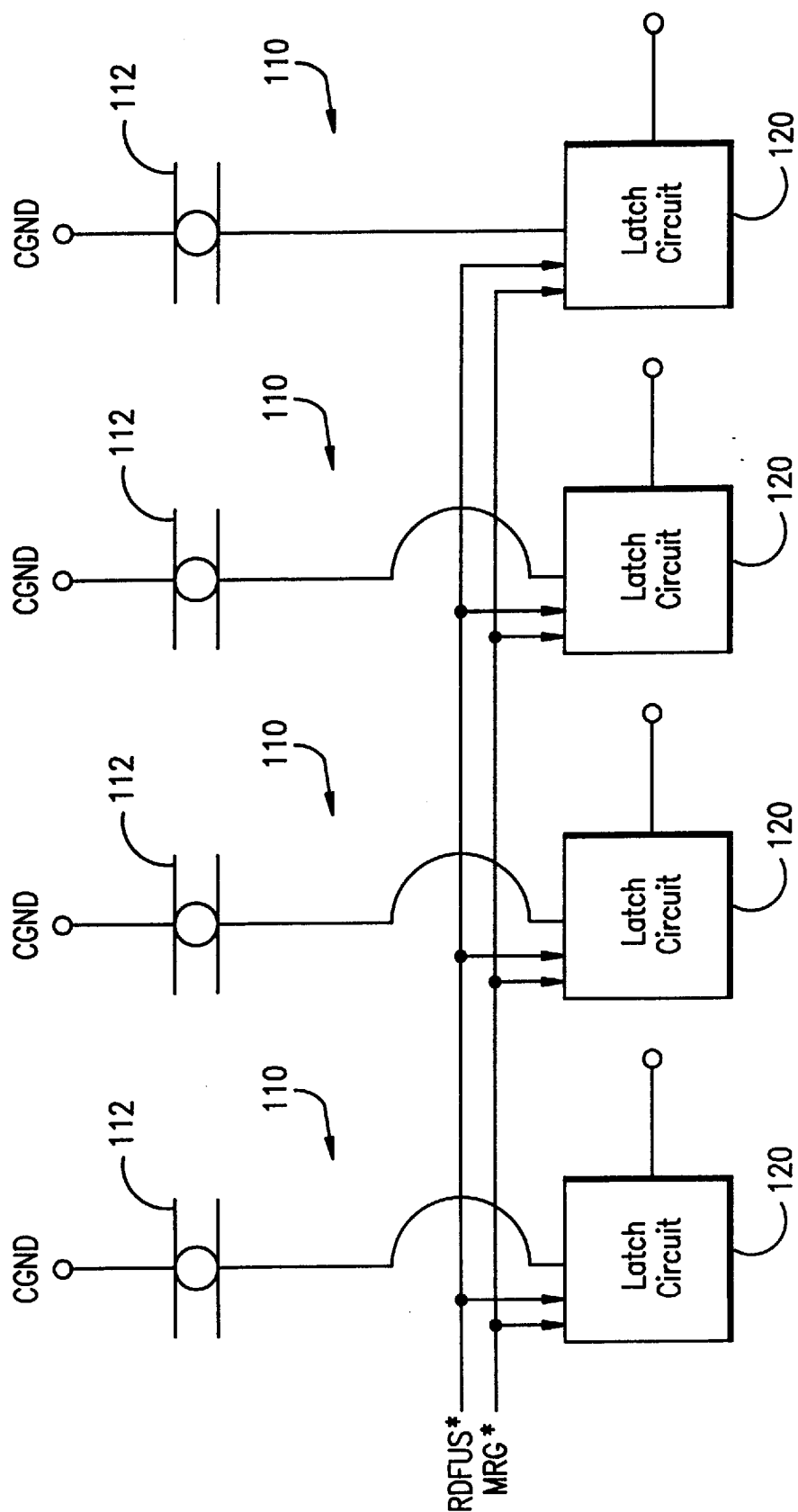
FIG. 5 illustrates the method of global testing the impedance of the antifuses contained within the address detection circuit illustrated in FIG. 1.

FIG. 5 illustrates the mechanism required to global test the impedance of all of the antifuses contained within the address detection circuit 100 (illustrated in FIG. 1). As you will note, the only circuitry required are the antifuses and the unique latch circuit 120 constructed in accordance with the present invention and the MRG* and RDFUS* signals. To test all of the antifuses 112 within the address detection circuit 100, the MRG* signal is pulsed low configuring the reference impedance $R_{REF}$ of all of the latch circuits 120. The RDFUS* signal is then pulsed low to test the impedance $R_{112}$ of all of the antifuses 112. Therefore, the status of all of the antifuses 112 can be tested at the same time (ie., global testing) without the use of additional test latch circuits 106 and multiplexers 104 required in the past (FIG. 3).

It must be noted that the reference impedance $R_{REF}$ can be created by more than two impedance elements and the invention is not to be limited to the use of only two impedances $R_{124}$, $R_{128}$ to formulate the desired reference impedances $R_{REF}$. The invention can utilize more than two impedance elements which may be configured, as described above, by appropriate configuration signals into desired reference impedances $R_{REF}$ to satisfy the particular needs of the manufacturer or the end user.

Figure 6:
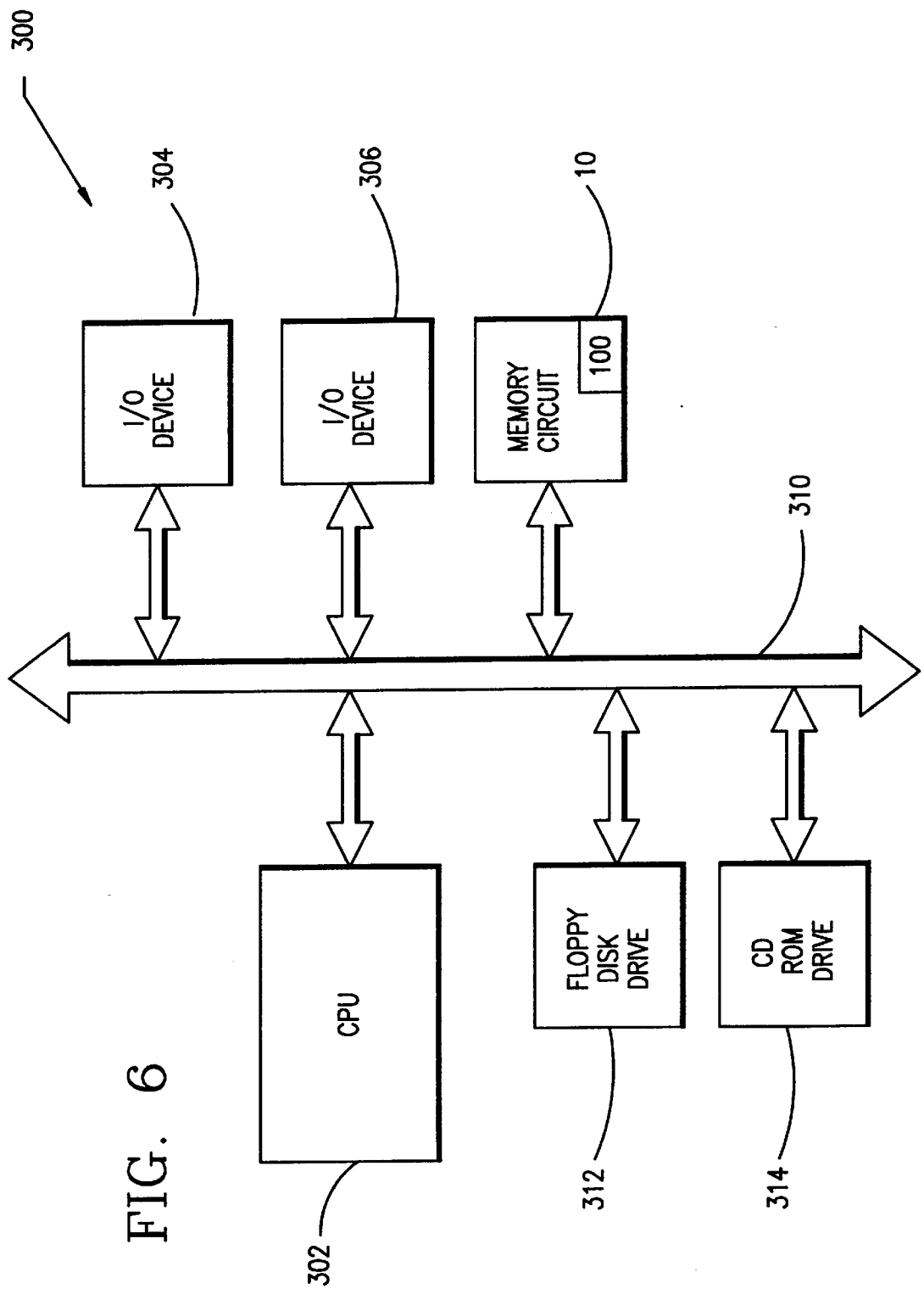

FIG. 6 illustrates a computer system 300 employing a memory circuit 10 that contains an address detection circuit 100 including the latch circuit 120 constructed in accordance with the present invention. The system 300 includes a central processing unit processor (CPU) for performing computer functions, such as executing software to perform desired tasks and calculations.

One or more input/output devices 304, 306 such as a keypad or a mouse, are coupled to the CPU 302 and allow an operator to manually input data thereto or to display or otherwise output data generated by the CPU 302. One or more peripheral devices such as a floppy disk drive 312 or a CD ROM drive 314 may also be coupled to the CPU 302. The computer system 300 also includes a bus 310 that couples the input/output devices 304, 306, the peripheral devices 312, 314 and the memory circuit 10 to the CPU 302.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention.

What is claimed as new and desired to be protected by Letters Patent of the United States is:

1. A latch circuit comprising:
   a reference circuit having an input signal and a reference impedance output representing a reference impedance, said input signal changing an impedance seen at the reference impedance output;

a sensing circuit for sensing an impedance of a programmable element, said sensing circuit having a sensing impedance output representing an impedance of said programmable element; and an output circuit connected to said reference impedance output and said sensing impedance output, said output circuit having an output signal, wherein said output signal represents a status of said programmable element determined by a comparison of said reference impedance output and said sensing impedance output in response to a control signal.

2. The circuit according to claim 1 wherein said input signal is a normal mode configuration signal and said reference impedance is set to a normal mode reference impedance.

3. The circuit according to claim 2 wherein said programmable element is an antifuse and said output signal represents a programmed antifuse.

4. The circuit according to claim 2 wherein said programmable element is an antifuse and said output signal represents an unprogrammed antifuse.

5. The circuit according to claim 1 wherein said input signal is a test mode configuration signal and said reference impedance is set to a test mode reference impedance.

6. The circuit according to claim 5 wherein said programmable element is an antifuse and said output signal represents a programmed antifuse with a proper impedance.

7. The circuit according to claim 5 wherein said programmable element is an antifuse and said output signal represents an unprogrammed antifuse with an improper impedance.

8. The circuit according to claim 1 wherein said reference circuit comprises:

a plurality of impedance elements connected in series, each of said plurality of impedance elements having a respective impedance; and a normally opened switch connected across at least one of said plurality of impedance elements, said switch being closed responsive to said input signal, wherein said reference impedance output consists of said impedance of said at least one impedance element connected to said switch when said switch is closed and said reference impedance output consists of said plurality of impedances when said switch is open.

9. The circuit according to claim 8 wherein each of said plurality of impedance elements and said switch are p-channel transistors.

10. The circuit according to claim 8 wherein a number of said plurality of impedance elements is two.

11. The circuit according to claim 1 wherein said latch circuit is included in a memory circuit to program redundant memory addresses.

12. An antifuse circuit comprising:

an antifuse, said antifuse having an unprogrammed state and a programmed state, said programmed state indicated by an impedance that is lower than an impedance of said unprogrammed state; and a latch circuit connected to said antifuse, said latch circuit comprising:

a reference circuit having an input signal and a reference impedance output representing a reference impedance, said input signal changing an impedance seen at the reference impedance output;

a sensing circuit for sensing the impedance of said antifuse to determine its state of programming, said sensing circuit having an antifuse impedance output representing an impedance of said antifuse; and an output circuit connected to said reference impedance output and said antifuse impedance output, said output circuit having an output signal, wherein said output signal represents a status of said antifuse determined by a comparison of said reference impedance output and said antifuse impedance output in response to a control signal.

13. The circuit according to claim 12 wherein said input signal is a normal mode configuration signal and said reference impedance is set to a normal mode reference impedance.

14. The circuit according to claim 13 wherein said output signal represents a programmed antifuse.

15. The circuit according to claim 13 wherein said output signal represents an unprogrammed antifuse.

16. The circuit according to claim 12 wherein said input signal is a test mode configuration signal and said reference impedance is set to a test mode reference impedance.

17. The circuit according to claim 16 wherein said output signal represents a programmed antifuse with a proper impedance.

18. The circuit according to claim 16 wherein said output signal represents a programmed antifuse with an improper impedance.

19. The circuit according to claim 12 wherein said reference circuit comprises:

a plurality of impedance elements connected in series, each of said plurality of impedance elements having a respective impedance; and a normally opened switch connected across at least one of said plurality impedance elements, said switch being closed responsive to said input signal, wherein said reference impedance output consists of said impedance of said at least one impedance element connected to said switch when said switch is closed and said reference impedance output consists of said plurality of impedances when said switch is open.

20. The circuit according to claim 19 wherein said plurality of impedance elements and said switch are p-channel transistors.

21. The circuit according to claim 19 wherein a number of said plurality of impedance elements is two.

22. The circuit according to claim 12 wherein said antifuse circuit is included in a memory circuit to program redundant memory addresses.

23. An address detection circuit comprising:

a plurality of antifuse, each of said plurality of antifuses having an unprogrammed state and a programmed state, said programmed state indicated by an impedance that is lower than an impedance of said unprogrammed state; and plurality of latch circuits, each of said plurality of latch circuits being respectively connected to one of said plurality of antifuses, each of said plurality of latch circuits comprising:

a reference circuit having an input signal and a reference impedance output representing reference impedance, said input signal changing an impedance of said reference impedance output;

a sensing circuit for sensing the impedance of said antifuse to determine its state of programming, said sensing circuit having an antifuse impedance output representing an impedance of said antifuse; and an output circuit connected to said reference impedance output and said antifuse impedance output, said output circuit having an output signal, wherein said output signal represents a status of said antifuse determined by a comparison of said reference impedance output and said antifuse impedance output in response to a control signal;

wherein a status of each of said plurality of antifuse is obtained in a parallel manner in response to said control signal.

24. The circuit according to claim 23 wherein said input signal is a normal mode configuration signal and said reference impedance is set to a normal mode reference impedance.

25. The circuit according to claim 24 wherein said output signal represents a programmed antifuse.

26. The circuit according to claim 24 wherein said output signal represents an unprogrammed antifuse.

27. The circuit according to claim 23 wherein said input signal is a test mode configuration signal and said reference impedance is set to a test mode reference impedance.

28. The circuit according to claim 27 wherein said output signal represents a programmed antifuse with a proper impedance.

29. The circuit according to claim 27 wherein said output signal represents a programmed antifuse with an improper impedance.

30. The circuit according to claim 23 wherein said reference circuit comprises:
   a plurality of impedance elements connected in series, each of said plurality of impedance elements having a respective impedance; and
   a normally opened switch connected across at least one of said plurality impedance elements, said switch being closed responsive to said input signal, wherein said reference impedance output consists of said impedance of said at least one impedance element connected to said switch when said switch is closed and said reference impedance output consists of said plurality of impedances when said switch is open.

31. The circuit according to claim 30 wherein said plurality of impedance elements and said switch are p-channel transistors.

32. The circuit according to claim 30 wherein a number of said plurality of impedance elements is two.

33. The circuit according to claim 23 wherein said address detection circuit is included in a memory circuit to program redundant memory addresses.

34. A computer system comprising:
   a processor;
   a memory circuit communicating with said processor, said memory circuit including an array of memory cells, and an address detection circuit, and a plurality of redundant memory cells, said address detection circuit comprising:
      a plurality of antifuses, each of said plurality of antifuses having an unprogrammed state and a programmed state, said programmed state indicated by an impedance that is lower than an impedance of said unprogrammed state; and
      a plurality of latch circuits, each of said plurality of latch circuits being respectively connected to one of said plurality of antifuses, each of said plurality of latch circuits comprising:
         a reference circuit having an input signal and a reference impedance output representing a reference impedance, said input signal changing an impedance seen at said reference impedance output;
         a sensing circuit for sensing the impedance of said antifuse to determine its state of programming, said sensing circuit having an antifuse impedance output representing an impedance of said antifuse; and
         an output circuit connected to said reference impedance output and said antifuse impedance output, said output circuit having an output signal, wherein said output signal represents a status of said antifuse determined by a comparison of said reference impedance output and said antifuse impedance output in response to a control signal;

wherein a status of each of said plurality of antifuses is obtained in a parallel manner in response to said control signal.

35. The system according to claim 34 wherein said input signal is a normal mode configuration signal and said reference impedance is set to a normal mode reference impedance.

36. The system according to claim 35 wherein said output signal represents a programmed antifuse.

37. The system according to claim 35 wherein said output signal represents an unprogrammed antifuse.

38. The system according to claim 34 wherein said input signal is a test mode configuration signal and said reference impedance is set to a test mode reference impedance.

39. The system according to claim 38 wherein said output signal represents a programmed antifuse with a proper impedance.

40. The system according to claim 38 wherein said output signal represents a programmed antifuse with an improper impedance.

41. The system according to claim 34 wherein said reference circuit comprises:
   a plurality of impedance elements connected in series, each of said plurality of impedance elements having a respective impedance; and
   a normally opened switch connected across at least one of said plurality of impedance elements, said switch being closed responsive to said input signal, wherein said reference impedance output consists of said impedance of said at least one impedance element connected to said switch when said switch is closed and said reference impedance output consists of said plurality of impedances when said switch is open.

42. The system according to claim 41 wherein said plurality of impedance elements and said switch are p-channel transistors.

43. The system according to claim 41 wherein a number of said plurality of impedance elements is two.

44. The system according to claim 23 wherein said address detection circuit is used to program redundant memory addresses.

45. A method of manufacturing a latch circuit comprising:
   providing a reference circuit having an input signal and a reference impedance output representing a reference impedance on a semiconductor device, said input signal changing an impedance of said reference impedance output;
   providing a sensing circuit for sensing an impedance of an antifuse on said semiconductor device, said sensing circuit having an antifuse impedance output representing an impedance of said antifuse; and
   providing an output circuit connected to said reference impedance output and said antifuse impedance output on said semiconductor device, said output circuit having an output signal, wherein said output signal represents a status of said antifuse determined by a comparison of said reference impedance output and said antifuse impedance output in response to a control signal.

46. The method according to claim 45 wherein said input signal is a normal mode configuration signal and said reference impedance is set to a normal mode reference impedance.

47. The method according to claim 46 wherein said output signal represents a programmed antifuse.

48. The method according to claim 46 wherein said output signal represents an unprogrammed antifuse.

49. The method according to claim 48 wherein said input signal is a test mode configuration signal and said reference impedance is set to a test mode reference impedance.

50. The method according to claim 49 wherein said output signal represents a programmed antifuse with a proper impedance.

51. The method according to claim 49 wherein said output signal represents a programmed antifuse with an improper impedance.

52. The method according to claim 45 wherein said step of providing a reference circuit comprises:
   providing a plurality of impedance elements connected in series, each of said plurality of impedance elements having a respective impedance; and
   providing a normally opened switch connected across at least one of said plurality of impedance elements, said switch being closed responsive to said input signal, wherein said reference impedance output consists of said impedance of said at least one impedance element connected to said switch when said switch is closed and said reference impedance output consists of said plurality of impedances when said switch is open.

53. The method according to claim 52 wherein said plurality of impedance elements and said switch are p-channel transistors.

54. The method according to claim 52 wherein a number of said plurality of impedance elements is two.

55. The method according to claim 46 wherein said latch circuit is included in a memory circuit to program redundant memory addresses.

56. A method of testing the impedance of a programmable element comprising:
   providing a reference circuit having a reference impedance output, said reference impedance output having an impedance configurable between a plurality of impedances, said reference impedance output having an impedance responsive to an input signal;
   providing an input signal to said reference circuit to configure said reference impedance output to have a selected impedance from said plurality of impedances;
   sensing the impedance of said programmable element; and
   determining the status of said programmable element by a comparison of said reference impedance output and said impedance of said programmable element.

57. The method according to claim 56 further comprising the step of outputting said status.

58. The method according to claim 56 further comprising the step of providing an input signal to said reference circuit to configure said reference impedance output to have an impedance that differs from said selected impedance.

59. The method according to claim 56 wherein a number of said plurality of impedances of said reference impedance is two.

* * * * *

UNITED STATES PATENT AND TRADEMARK OFFICE
CERTIFICATE OF CORRECTION

PATENT NO. : 5,892,716
DATED : April 6, 1999
INVENTOR(S) : Charles L. Ingalls

It is certified that error appears in the above-identified patent and that said Letters Patent is hereby corrected as shown below:

COLUMN 2:
   line 32, cancel "antifuse", substitute --antifuses--; and
   line 66, cancel "antifuse", substitute -- antifuses--.

COLUMN 5:
   line 1, cancel "antifuse", substitute --antifuses--.

COLUMN 7:
   line 10, cancel "inveter", substitute --inverter--;
   line 42, insert --112-- after "antifuse"; and
   line 64, cancel "fuse", substitute --fuses--.

COLUMN 10:
   claim 23, line 7, insert --a-- before the first occurrence of "plurality".

UNITED STATES PATENT AND TRADEMARK OFFICE
CERTIFICATE OF CORRECTION

PATENT NO. : 5,892,716
DATED : April 6, 1999
INVENTOR(S) : Charles L. Ingalls

It is certified that error appears in the above-identified patent and that said Letters Patent is hereby corrected as shown below:

COLUMN 11:
    claim 23, line 26, cancel "antifuse", substitute --antifuses--.

Signed and Sealed this

Seventh Day of September, 1999

Q. TODD DICKINSON

*Attest:*

*Attesting Officer*

*Acting Commissioner of Patents and Trademarks*